(12) United States Patent
Kume et al.

(10) Patent No.: US 8,258,505 B2
(45) Date of Patent: Sep. 4, 2012

(54) ORGANIC ELECTROLUMINESCENCE DISPLAY APPARATUS AND MANUFACTURING METHOD THEREFOR

(75) Inventors: Akiya Kume, Wako (JP); Kazuya Igarashi, Chiba (JP); Kohei Nagayama, Chiba (JP); Nobuhiko Sato, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 155 days.

(21) Appl. No.: 12/674,456

(22) PCT Filed: Jun. 26, 2009

(86) PCT No.: PCT/JP2009/062160
§ 371 (c)(1),
(2), (4) Date: Feb. 22, 2010

(87) PCT Pub. No.: WO2009/157591
PCT Pub. Date: Dec. 30, 2009

(65) Prior Publication Data
US 2011/0186819 A1  Aug. 4, 2011

(30) Foreign Application Priority Data

Jun. 27, 2008 (JP) ................................ 2008-169154
Jun. 22, 2009 (JP) ................................ 2009-147398

(51) Int. Cl.
*H01L 29/72* (2006.01)
(52) U.S. Cl. ............ 257/40; 257/81; 257/774; 313/504; 372/96

(58) Field of Classification Search .................... 257/40, 257/81, 774; 313/504; 372/96
See application file for complete search history.

(56) References Cited

U.S. PATENT DOCUMENTS

| | | | |
|---|---|---|---|
| 6,566,806 B1 | 5/2003 | Kawai | ............ 313/504 |
| 2003/0063649 A1* | 4/2003 | Ezaki et al. | ............ 372/96 |
| 2005/0062408 A1* | 3/2005 | Yoo et al. | ............ 313/504 |

FOREIGN PATENT DOCUMENTS

| | | |
|---|---|---|
| JP | 10-012380 | 1/1998 |
| JP | 2002-124380 | 4/2002 |
| JP | 2004-140003 | 5/2004 |
| JP | 2007-227232 | 9/2007 |
| WO | WO 2007004115 A2 | 1/2007 |

* cited by examiner

*Primary Examiner* — Edward Wojciechowicz
(74) *Attorney, Agent, or Firm* — Fitzpatrick, Cella, Harper & Scinto

(57) ABSTRACT

Provided is a manufacturing method for an organic electroluminescence display apparatus in which processing uniformity is kept during partial removal processing of an electrode layer or an organic compound layer. The organic electroluminescence display apparatus includes: a substrate; and a light-emitting device including an organic compound layer including an emission layer sandwiched between electrodes formed on the substrate, in which: two or more of the light-emitting devices are provided, and the light-emitting devices are stacked in a direction perpendicular to the substrate; at least one of the electrodes and the organic compound layers in the two or more light-emitting devices includes openings; and the openings are positioned so as not to overlap with one another in the direction perpendicular to the substrate.

3 Claims, 2 Drawing Sheets

ORGANIC ELECTROLUMINESCENCE DISPLAY APPARATUS AND MANUFACTURING METHOD THEREFOR

TECHNICAL FIELD

The present invention relates to an organic electroluminescence (EL) display apparatus and a manufacturing method for the same.

BACKGROUND ART

An organic EL device is a device in which an emission layer is held between an anode and a cathode. Electrons and holes are injected from a cathode layer and an anode layer, respectively, and combined in the emission layer, thus causing the organic EL device to emit light.

When an organic EL device is used as a component of a display monitor, partial removal processing of its electrode layers and organic compound portion, which includes the emission layer, is indispensable and, as recent display apparatuses are acquiring higher definition, the removal processing is requested to improve in precision.

The partial removal processing of the electrode layers and the organic compound layer which constitute an organic EL device is accomplished specifically by a processing method that avoids mechanical contact, such as light irradiation. For example, Japanese Patent Application Laid-Open No. 2002-124380 discloses a method in which an organic compound layer on a glass substrate and on an ITO thin film is removed by laser ablation.

To give another example, Japanese Patent Application Laid-Open No. 2004-140003 discloses a method which uses laser ablation to perform microprocessing on a metal-based electrode layer placed on an organic compound layer.

A stacked type organic EL display apparatus laminates together two or more light-emitting devices each including an organic compound layer that is held between at least two electrode layers and that includes at least an emission layer. This type of organic EL display apparatus requires special processing to be performed on the electrode layers and the organic compound layers.

Specific examples of the special processing include forming openings at desired points in the respective organic compound layers in order to make a given organic compound layer emit light through pixel-basis electric connection with TFT circuits, which are formed on a substrate in advance. The examples also include removal processing for breaking up an electrode layer so that the electrode layer in one pixel is separated from the electrode layer in another pixel. The special processing leaves concavities in places where the openings are formed or part of the electrode layer is removed.

If an organic compound layer or an electrode layer is formed on the layer where those concavities were created, and then the processing method described in Japanese Patent Application Laid-Open No. 2002-124380 or Japanese Patent Application Laid-Open No. 2004-140003 is used to perform removal processing on the places having the concavities, the following problems may arise.

In the case of processing an organic compound layer, laser light incident upon the concavities is refracted and scattered unintendedly in the concavities and reaches unintended places.

This creates a change in the energy density distribution of laser light within an area where partial removal processing is performed, with the possible result that the processing rate is fluctuated to a degree that makes the processed shape deviate from design values.

For example, the change of the energy density distribution can cause the partial removal processing (formation of so-called contact holes) of a given organic compound layer to reach an electrode layer that is not to receive removal processing, thus bringing about unintended wire breakage.

In the case of removal processing of a given electrode layer, the change of the energy density distribution can cause the processing to reach an organic compound layer that is not to receive removal processing, thus exposing an electrode layer that underlies this organic compound layer.

As a result, if a different organic compound layer is laid on top thereof in the next step, the organic compound layer above the exposed electrode layer, which is not intended for light emission may emit light, depending on the electric potential of the underlying exposed electrode layer.

As described above, a stacked type organic EL display apparatuses thus have a problem of unintended removal processing which is brought about by a failure in accomplishing uniform removal processing of an organic compound layer or an electrode layer, and which results in a short circuit, or unintended light emission in a pixel when its adjacent pixel emits light.

DISCLOSURE OF THE INVENTION

An object of the present invention is to provide a stacked type organic EL display apparatus and a manufacturing method therefor in which processing uniformity is kept during partial removal processing of an electrode layer or an organic compound layer.

According to the present invention, there is provided an organic EL display apparatus, including:
a substrate; and
a light-emitting device comprising an organic compound layer including an emission layer sandwiched between electrodes formed on the substrate, in which:
two or more of the light-emitting devices are provided, and the light-emitting devices are stacked in a direction perpendicular to the substrate;
at least one of the electrodes and the organic compound layers in the two or more light-emitting devices includes openings; and
the openings are positioned so as not to overlap with one another in the direction perpendicular to the substrate.

Further features of the present invention will become apparent from the following description of exemplary embodiments with reference to the attached drawings.

BRIEF DESCRIPTION OF THE DRAWINGS

FIG. 2 is a schematic sectional view illustrating a state in which laser ablation is performed in a place where a processing target does not have a flat shape due to a level difference or the like.

BEST MODE FOR CARRYING OUT THE INVENTION

Figure 1:
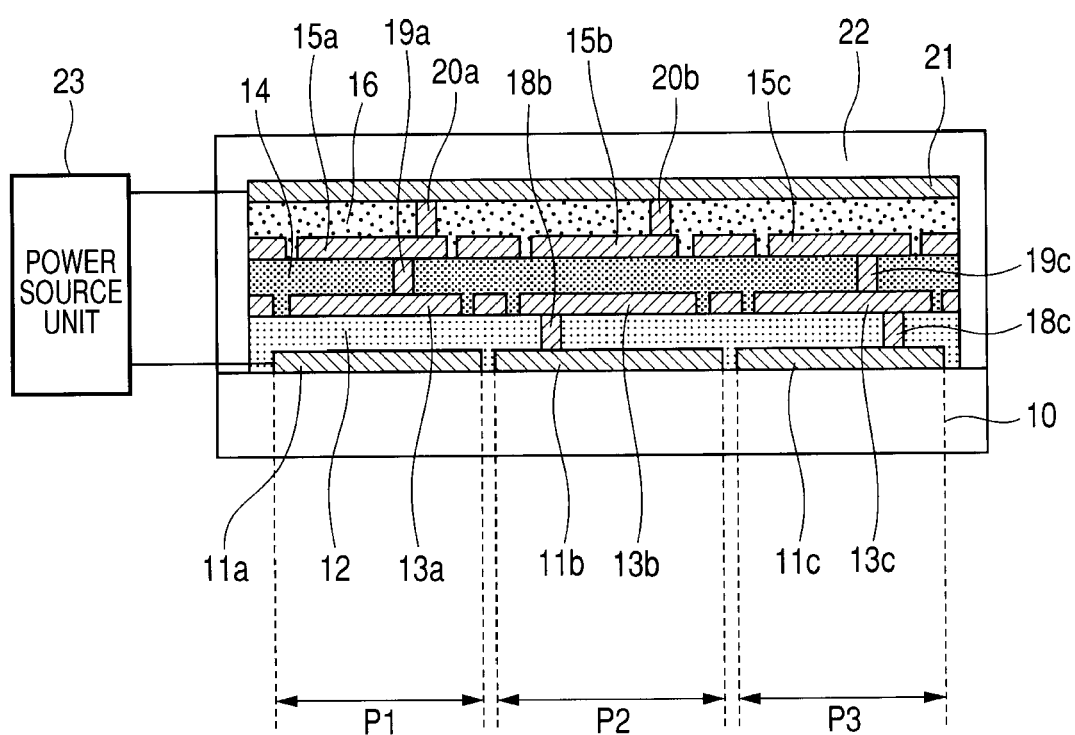
FIG. 1 is a sectional view illustrating a concrete example of an organic EL display apparatus manufactured by a manufacturing method of the present invention.

An organic EL display apparatus of the present invention includes the followings:
a substrate; and
two or more light-emitting devices each including an organic compound layer which is held between electrodes formed on the substrate and which includes an emission layer, the light-emitting devices being stacked in a direction perpendicular to the substrate.

In the two or more light-emitting devices, contact holes (openings) are formed in at least one of the electrodes and the organic compound layer, and the openings are positioned so as not to overlap with one another in the direction perpendicular to the substrate.

A manufacturing method of the present invention is a manufacturing method for an organic EL display apparatus including: a substrate; and multiple pixels each including at least three electrode layers, which are formed on the substrate, and an organic compound layer, which is placed between the electrode layers and which includes at least an emission layer.

In the present invention, processing is performed to partially remove an electrode layer and an organic compound layer that constitute the organic EL display apparatus (hereinafter may referred to as removal processing). This removal processing is performed in an area where the top and bottom interfaces of a layer to be processed (electrode layer or organic compound layer) are parallel to a substrate.

The area where the interfaces and the substrate are parallel is an area that is within the electrode layer or the organic compound layer underlying the processing target layer in a direction perpendicular to the substrate and that has not subjected to removal processing. In the area that is within the electrode layer or the organic compound layer underlying the processing target layer in a direction perpendicular to the substrate and that has not subjected to removal processing, this electrode layer or organic compound layer is parallel to the substrate and, accordingly, the processing target layer is parallel to the substrate as well.

In the case where processing removal was performed in an area within the electrode layer or the organic compound layer underlying the processing target layer, the area where the removal processing was performed forms concavities in the processing target layer, and hence makes the top and bottom interfaces of the processing target layer (electrode layer or organic compound layer) unparallel to the substrate.

An electrode layer or an organic compound layer on which removal processing is performed is desirably a layer that is formed commonly to multiple pixels constituting the organic EL display apparatus.

An area where removal processing is performed is desirably positioned so as not to overlap with a processing area of a layer underlying the removal processing target layer and with a processing area of a layer immediately below this underlying layer in a direction perpendicular to the substrate. Note that a processing area means an area where removal processing is performed.

For example, when removal processing is performed on an electrode layer, an area in which part of the electrode layer is removed by processing is desirably off from a processing area of an organic compound layer underlying the electrode layer and from a processing area of an electrode layer that is immediately below the organic compound layer. In short, it is preferable to avoid overlapping of areas where removal processing is performed between electrode layers in a direction perpendicular to the substrate.

Similarly, when removal processing is performed on an organic compound layer, an area in which part of the organic compound layer is removed by processing is desirably off from a processing area of an electrode layer underlying the organic compound layer and from a processing area of an organic compound layer that is immediately below the electrode layer. In short, it is preferable to avoid overlapping of areas where removal processing is performed between organic compound layers in a direction perpendicular to the substrate.

A groove or a hole formed by processing for removing part of an electrode layer or an organic compound layer is completely filled by forming another organic compound layer or electrode layer after the processing. However, even with another layer formed, an area where the processing was performed is slightly dented in the shape of the groove or the hole, compared to an area that has not subjected to the processing. Therefore, when removal processing is performed on the additionally formed layer (organic compound layer or electrode layer) in a place that overlaps with the removal processing area of the layer underlying the additionally formed layer by, for example, light irradiation, the place is not irradiated with uniform light and a certain energy distribution is created.

A manufacturing method for an organic EL display apparatus according to an embodiment of the present invention is described below with reference to the drawings. However, the present invention is not limited thereto.

FIG. 1 is a schematic sectional view illustrating a concrete example of an organic EL display apparatus manufactured by a manufacturing method of the present invention. The organic EL display apparatus of FIG. 1 has a pixel structure in which three subpixels constitute one pixel unit. Each subpixel includes four electrode layers and three organic compound layers in total which are each placed between the four electrode layers. Each of the three organic compound layers in the organic EL display apparatus of FIG. 1 includes an emission layer that emits light of a color different from those of the other two organic compound layers.

The number of electrode layers is not limited to four layers and is usually three to seven layers, though the voltage applied to the organic EL display apparatus has to be taken into account. Desirably, three to five electrode layers are formed.

An organic compound layer placed between electrode layers only needs to contain an emission layer. The following modes (a) to (e) are given as concrete modes of the organic compound layer, but the present invention is not limited thereto:

(a) Single layer type (emission layer)
(b) Two-layer type (emission layer/hole injection layer)
(c) Three-layer type (electron transport layer/emission layer/hole transport layer)
(d) Four-layer type (electron injection layer/emission layer/hole transport layer/hole injection layer)
(e) Five-layer type (electron injection layer/electron transport layer/emission layer/hole transport layer/hole injection layer)

In FIG. 1, the organic EL display apparatus according to this embodiment is a top emission organic EL display apparatus. Denoted by 10 is an insulating substrate, 11a, 11b, and 11c, first electrode layers, 12, a first organic compound layer, 13a, 13b, and 13c, second electrode layers, and 14, a second organic compound layer. Denoted by 15a, 15b, and 15c are third electrode layers, 16, a third organic compound layer, 21, a fourth electrode layer, 18b, 18c, 19a, 19c, 20a, and 20b, contact holes, and 23, a power source unit. An organic compound layer of this embodiment has a three-layer structure and is constituted of an electron transport layer, an emission layer, and a hole transport layer. A contact hole (opening) is formed in an area where the top and bottom interfaces of a relevant organic compound layer are parallel to a substrate. In the case of the first electrode layers, the second electrode layers, and the third electrode layers, an opening is formed in an area where the top and bottom interfaces of a relevant electrode layer are parallel to the substrate. Electrode layers contained in a subpixel, which are described later, and each electrode layers serve as an electrode layer for driving the subpixel, whereas an electrode layer located between a subpixel and another subpixel does not serve as an electrode layer for driving a subpixel.

In the present invention, a contact hole (opening) formed in one organic compound layer is desirably placed so as not to overlap with a contact hole formed in another organic compound layer that is below the organic compound layer. Specifically, the contact holes 19a and 19c which are formed in the second organic compound layer are located such that they do not overlap with the contact holes 18b and 18c which are formed in the first organic compound layer. Also, the contact holes 20a and 20b which are formed in the third organic compound layer are located such that they do not overlap with the contact holes 18b, 18c, 19a, and 19c which are formed in the first organic compound layer and the second organic compound layer.

In the organic EL display apparatus described above, one pixel is constituted of a first subpixel P1, a second subpixel P2, and a third subpixel P3.

The insulating substrate 10 has switching devices such as TFTs formed in advance as needed. The first electrode layers are formed in pixel regions of the insulating substrate 10. An electrode layer is desired to be made of a material reflective of light, for example, Cr, Al, Ag, Au, or Pt. This is because a material having a higher reflectance improves the efficiency of taking out light more.

The first organic compound layer is formed on this substrate by deposition through a known measure.

The first organic compound layer can employ at least one type of material selected from the group consisting of an organic light emission material, a hole injection material, an electron injection material, a hole transport material, and an electron transport material. The range of choice for the color of emitted light can be widened by, for example, doping a hole injection material or a hole transport material with an organic light emission material, or by doping an electron injection material or an electron transport material with an organic light emission material. The organic compound layer is desirably an amorphous film from the standpoint of light emission efficiency.

Examples of employable organic light emission materials of various colors include triarylamine derivatives, stilbene derivatives, polyarylene, aromatic fused polycyclic compounds, aromatic heterocyclic compounds, aromatic heterocyclic fused ring compounds, metal complex compounds, and their homo-oligomers or hetero-oligomers. However, constituents of the present invention are not limited to the materials given as examples.

The organic compound layer may be a single-function layer having one of the hole injection function, the hole transport function, the electron injection function, and the electron transport function, or may be a multi-function layer having two or more of those functions.

The thickness of the organic compound layer is desirably 0.1 µm to 0.5 µm, more desirably, 0.15 µm to 0.35 µm.

Examples of employable hole injection and transport materials include phthalocyanine compounds, triarylamine compounds, conductive polymers, perylene-based compounds, and Eu complexes. However, constituents of the present invention are not limited to the materials given as examples.

Examples of employable electron injection and transport materials include $Alq_3$, which is aluminum coordinated with a trimer of 8-hydroxy quinoline, azomethine zinc complexes, and distyryl biphenyl derivatives.

Next, the contact holes 18b and 18c are formed by performing partial removal processing in areas where the top and bottom interfaces of the first organic compound layer are parallel to the substrate. The partial removal processing is implemented by dry etching that uses etching gas, ions, radicals, or plasma, or by light irradiation. Light irradiation is desirable. A preferable light irradiation method is laser light irradiation. Among laser light irradiation methods such as laser ablation, laser ablation is desirable.

When laser ablation is employed, the substrate is irradiated in a given pattern by scanning the substrate with laser light that is converged to a spot beam a few µm in diameter, or by using a planar light source through a mask that lets light transmit in places where contact holes are to be formed. The diameter of the contact holes is desirably 0.1 to 15 µm, more desirably, 1 µm to 10 µm.

Laser ablation is a microprocessing method that utilizes a phenomenon in which, upon absorption of laser light irradiating a processing target, a substance is discharged explosively in the form of various fragments.

Examples of employable laser species include YAG lasers (including SHG and THG), semiconductor lasers, dye lasers, carbon dioxide lasers, helium-neon lasers, argon ion lasers, and excimer lasers.

It is necessary to choose a laser wavelength and a laser output that suit the material of the processing target, the planar dimensions of patterning, and the depth of processing. Laser conditions/settings fit to the target electrode layer or organic compound layer are determined in advance through experiments.

Figure 2:
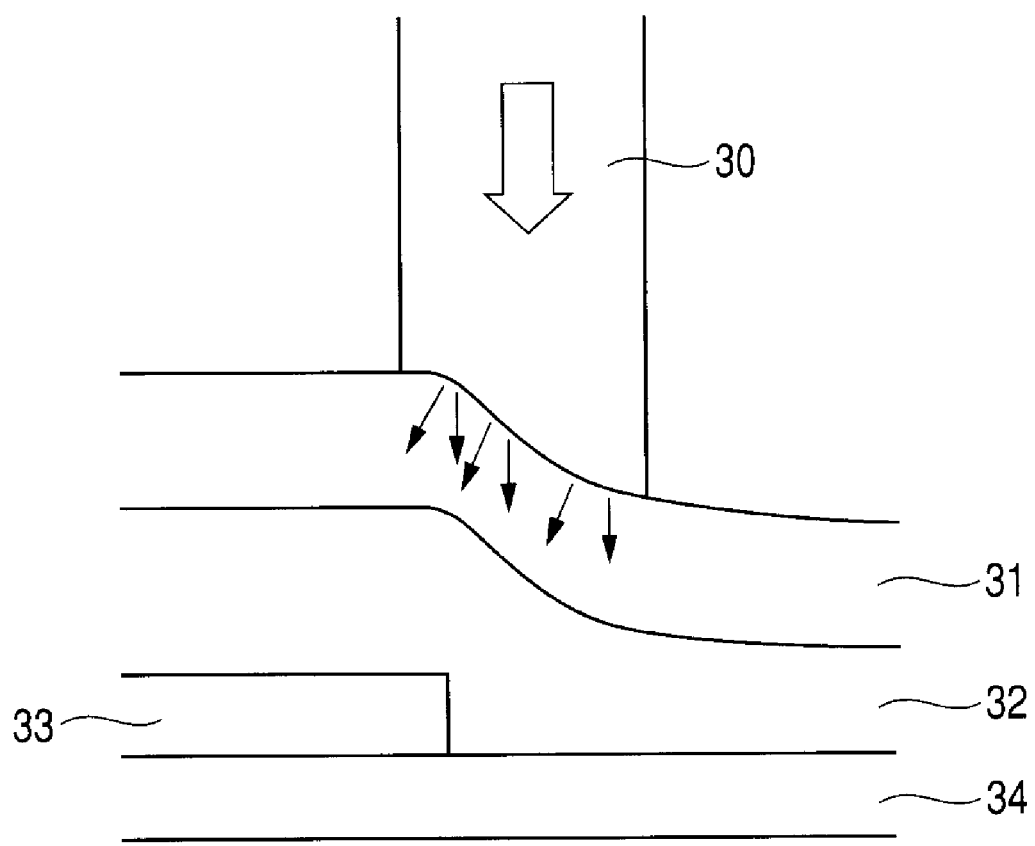

FIG. 2 is a schematic diagram in which laser ablation is performed in a place where a processing target does not have a flat shape due to a level difference or the like. In the case where an area in which laser ablation is performed is immediately above the edge of an underlying layer 33, which underlies a layer to be processed (organic compound layer 32 or electrode layer 31) placed on a substrate 34, the processing target layer is not flat in this area. Accordingly, laser light 30 is refracted and scattered upon incident, and an energy density distribution of laser light is created within the partial removal processing area. Overprocessing and underprocessing are caused following the pattern of the energy density distribution. This results in a serious defect in electrode layer structure of the organic EL display apparatus.

To avoid this, it is important to perform laser ablation in a flat place. Concrete examples of a structure that causes surface irregularities include an electrode layer that constitutes a TFT, an electrode layer between TFTs, a capacitor, a contact hole in a take-out electrode layer, and the edge of the first electrode layer. Flat places can be found anywhere but above those structures.

Next, a transparent electrode layer is formed and subjected to partial removal processing to form the second electrode layers 13a, 13b, and 13c. At this point, the first electrode layers 11b and 11c and the second electrode layers 13b and 13c are connected to each other through the contact holes 18b and 18c, respectively. A desirable electrode material is a material that is high in transmittance, for example, a transparent conductive film or an organic conductive film made of ITO, IZO, or ZnO. Alternatively, the electrode layer material may be a semi-transmissive film formed from a metal such as Ag or Al to a thickness of about 10 nm to 30 nm. The partial removal processing is accomplished by performing the above-described laser ablation in flat places.

Next, the same method as described above is used to form the second organic compound layer 14, the contact holes 19a and 19c, the third electrode layers 15a, 15b, and 15c, the third organic compound layer 16, and the contact holes 20a and 20b in order.

The fourth electrode layer 21 is then formed by sputtering or other methods. The materials of the third electrode layers and the fourth electrode layer are desirably materials that have a high transmittance, as is the case with the second electrode layers. A silicon oxynitride film is subsequently formed as a protective film 22, whereby the organic EL display apparatus is obtained.

The manufacturing method for the organic EL display apparatus described above is a method of manufacturing a top emission, active matrix drive display apparatus. However, the above-described processing method is not limited to a particular light take-out method or device driving method, and is applicable to, for example, a bottom emission display apparatus and an active matrix drive display apparatus as well.

The manufacturing method for the organic EL display apparatus described above can also be used to form contact holes for connecting TFTs or other switching devices and the first electrodes with each other.

As described above, the present invention can provide a manufacturing method for an organic EL display apparatus in which processing uniformity is kept during partial removal processing of an electrode layer or an organic compound layer.

Also, in an organic EL display apparatus manufactured according to the present invention, accidental short circuits and unintended light emission in a pixel when its adjacent pixel emits light are prevented and the manufacturing yield is improved.

Moreover, in an organic EL display apparatus obtained according to the present invention, light emission in a pixel due to a drive TFT of its adjacent pixel is prevented.

The present invention is described further through the following Examples, but is not limited thereto.

EXAMPLE 1

The organic EL display apparatus illustrated in FIG. 1 was manufactured as follows.
(Formation of Electrode Layers and Organic Compound Layers)

Vacuum vapor deposition was performed in a vacuum chamber to form the electrode layers and the organic compound layers illustrated in FIG. 1. During the vacuum vapor deposition, the pressure in the vacuum chamber was set to $1.0 \times 10^{-4}$ Pa and constituent materials and thicknesses shown in the following Table 1 were employed for the electrode layers and the organic compound layers.

TABLE 1

| | | Constituent material | Thickness (nm) |
|---|---|---|---|
| First electrode layer | | Ag | 150 |
| First organic compound layer | Hole transport layer | α-NPD | 120 |
| | Emission layer | Alq$_3$ + Ir(Ppy)$_3$ | 150 |
| | Electron transport layer | BPhen | 40 |
| Second electrode layer | | IZO | 100 |
| Second organic compound layer | Hole transport layer | α-NPD | 120 |
| | Emission layer | Alq$_3$ + Coumarin 6 | 200 |
| | Electron transport layer | BPhen | 40 |
| Third Electrode layer | | IZO | 100 |
| Third organic compound layer | Hole transport layer | α-NPD | 120 |
| | Emission layer | Balq + Perylene | 200 |
| | Electron transport layer | BPhen | 40 |
| Fourth electrode layer | | IZO | 100 |

(Step of Partial Removing the Organic Compound Layers)

In this Example, partial removal processing was performed on the first electrode layer, the first organic compound layer, the second electrode layer, the second organic compound layer, the third electrode layer, and the third organic compound layer.

The removal processing of the organic compound layers employed laser ablation. An excimer laser was used as laser species for laser ablation, and its laser light was adjusted to obtain a 5 mm square laser beam with a wavelength of 248 nm. The laser power applied to the organic compound layers during laser light irradiation was set to 100 mJ/cm$^2$, and formed in one shot. A chromium mask was used as a mask for the partial removal processing. The partial removal processing was executed in the vacuum chamber where the organic compound layers to be subjected to removal processing were formed.

The contact holes 19a and 19c formed in the second organic compound layer were set completely off from the contact holes 18b and 18c formed in the first organic compound layer. The contact holes 20a and 20b formed in the third organic compound layer were set completely off from the contact holes 19a and 19c formed in the second organic compound layer.

Through the above-described removal processing, the contact holes 18b and 18c were formed in the first organic compound layer. Similarly, the contact holes 19a and 19c and the contact holes 20a and 20b were formed in the second organic compound layer and the third organic compound layer, respectively. The diameter of the contact holes formed was 5 μm.

Observation of the shape after the processing revealed that uniform contact holes were formed.

The location of a contact hole in one organic compound layer is completely off from the location of a contact hole in an organic compound layer one layer below, and hence the level difference in the contact hole portion can be reduced in magnitude. This ensures that the edge of a contact hole is covered with a transparent electrode layer material. Accordingly, disconnection caused by steps was avoided and open defects of an electric circuit was successfully prevented.

The edge of the contact hole is also covered securely in the next step with an organic compound layer, which serves as an insulator. Short circuit defects of an electric circuit was thus avoided.
(Step of Partially Removing the Electrode Layers)

Partial removal processing was performed on the second electrode layer and the third electrode layer. The laser power applied for the partial removal processing was 500 mJ/cm$^2$ and formed in four shots. The removal processing divided the second electrode layer into the layers 13a, 13b, and 13c, and the third electrode layer into layers 15a, 15b, and 15c. The removal processing width was set to 7 μm in dividing the second electrode layer and the third electrode layer by partial removal processing. The partial removal processing areas of the third electrode layer were positioned so as not to completely overlap with the removal processing areas of the second electrode layer.

Observation of the shape after the processing revealed that uniform sections were formed in the electrode layers.

The organic EL display apparatus manufactured by the above-described method was driven to emit light for observation. It was confirmed as a result that the display apparatus has no pixel defects.

Desirably, a contact hole formed in an organic compound layer and a partial removal processing area in an electrode layer do not overlap with each other. In this way, accidental short circuits of an electric circuit can be avoided and unintended light emission in a pixel is prevented when its adjacent pixel emits light.

COMPARATIVE EXAMPLE 1

An organic EL display apparatus was manufactured by the same method as Example 1, except that Comparative Example modifies the partial removal processing of the second electrode layers of Example 1 by performing the partial removal processing in areas that overlap with the edges of the first electrode layers 11a, 11b, and 11c.

Observation of the shape after the processing revealed that nonuniform sections were formed in the electrode layers. It also seems that ablation in the depth direction was insufficient in some of the partial removal processing areas.

A short circuit was found as a result of electric resistance measurement, confirming that the manufactured apparatus cannot be driven as an organic EL display apparatus.

While the present invention was described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2008-169154, filed Jun. 27, 2008, and No. 2009-147398, filed Jun. 22, 2009, which are hereby incorporated by reference herein in their entirety.

The invention claimed is:

1. An organic electroluminescence display apparatus comprising:
 a substrate; and
 multiple pixels each including a first electrode layer, a first organic compound layer, a second electrode layer, a second organic compound layer, and a third electrode layer which are stacked on the substrate in this order in a perpendicular direction with regard to the substrate,
 wherein the first electrode layer, the second electrode layer and the third electrode layer are divided into multiple regions by gaps formed in the first electrode layer, the second electrode layer, and the third electrode layer,
 wherein the gaps in the first electrode layer are filled with the first organic compound layer, and the gaps in the second electrode layer are filled with the second compound layer, and
 wherein the gaps in the first electrode layer, the gaps in the second electrode layer, and the gaps in the third electrode layer do not overlap each other in the perpendicular direction with regard to the substrate.

2. The organic electroluminescence display apparatus according to claim 1, wherein the first organic compound layer is provided with a contact hole to electrically connect the first electrode layer with the second electrode layer,
 wherein the second organic compound layer is provided with a contact hole to electrically connect the second electrode layer with the third electrode layer, and
 wherein the contact hole provided in the first organic compound layer does not overlap with the contact hole provided in the second compound layer in the perpendicular direction with regard to the substrate.

3. The organic electroluminescence display apparatus according to claim 1, further comprising a third organic compound layer and a fourth electrode layer,
 wherein the third organic compound layer is provided on the third electrode layer and the gaps in the third electrode layer are filled with the third organic compound layer, and the fourth electrode layer is provided on the third organic compound layer,
 wherein a contact hole is provided in the third organic compound layer to electrically connect the third electrode layer with the fourth electrode layer, and
 wherein the contact hole provided in the first organic compound layer, the contact hole provided in the second organic compound layer, and the contact hole provided in the third organic compound layer do not overlap each other in the perpendicular direction with regard to the substrate.

\* \* \* \* \*